United States Patent
Wang

(10) Patent No.: US 10,230,248 B2
(45) Date of Patent: Mar. 12, 2019

(54) MAINTENANCE METHOD OF POWER BATTERY PACK

(71) Applicant: HANGZHOU GOLD ELECTRONIC EQUIPMENT INC., LTD., Hangzhou, Zhejiang Province (CN)

(72) Inventor: Hao Wang, Hangzhou (CN)

(73) Assignee: HANGZHOU GOLD ELECTRONIC EQUIPMENT INC., LTD., Hangzhou (CN)

(*) Notice: Subject to any disclaimer, the term of this patent is extended or adjusted under 35 U.S.C. 154(b) by 70 days.

(21) Appl. No.: 15/324,673

(22) PCT Filed: Jan. 19, 2016

(86) PCT No.: PCT/CN2016/071355
§ 371 (c)(1),
(2) Date: Jan. 6, 2017

(87) PCT Pub. No.: WO2016/119609
PCT Pub. Date: Aug. 4, 2016

(65) Prior Publication Data
US 2018/0183245 A1    Jun. 28, 2018

(30) Foreign Application Priority Data
Jan. 28, 2015 (CN) .......................... 2015 1 0042071

(51) Int. Cl.
*H02J 7/00* (2006.01)
*G01R 31/36* (2019.01)
(Continued)

(52) U.S. Cl.
CPC ............ *H02J 7/0021* (2013.01); *G01R 31/36* (2013.01); *G01R 31/3624* (2013.01);
(Continued)

(58) Field of Classification Search
CPC ............... H02J 7/0021; G01R 31/3624; G01R 31/3651; G01R 31/3658; G01R 31/3675;
(Continued)

(56) References Cited

U.S. PATENT DOCUMENTS

2009/0015203 A1* 1/2009 Oakes .................... G06Q 40/00
 320/132
2013/0314054 A1* 11/2013 Bergqvist ............. H01M 10/44
 320/162

\* cited by examiner

*Primary Examiner* — Nathaniel Pelton
(74) *Attorney, Agent, or Firm* — Jiwen Chen

(57) ABSTRACT

An improved maintenance method of a power battery pack is disclosed herein, comprising the following steps: (1) conducting analysis on battery pack; (2) data preprocessing; (3) conducting normalization processing of voltage data volavg$_i$ obtained in (2) and state of charge SOC$_i$, state of health SOH$_i$ of single cells respectively; (4) calculating the charging and discharging levels of single cell that needs to maintain, and determining the battery sets that require charging and discharging maintenance. The maintenance method of power battery pack in the invention can perform analysis of various characteristic data of battery in a real-time manner and pick up the single cells that need charging and discharging maintenance during battery pack operation, and control the ratio of number of batteries that need charging maintenance to that needs discharging maintenance, to achieve bus balance.

4 Claims, 3 Drawing Sheets

(51) Int. Cl.
*H01M 10/42* (2006.01)
*H01M 10/44* (2006.01)
*H01M 10/48* (2006.01)

(52) U.S. Cl.
CPC ..... *G01R 31/3651* (2013.01); *G01R 31/3658* (2013.01); *G01R 31/3675* (2013.01); *G01R 31/3679* (2013.01); *H01M 10/4207* (2013.01); *H01M 10/441* (2013.01); *H01M 10/482* (2013.01); *H01M 10/486* (2013.01); *H01M 2220/20* (2013.01)

(58) Field of Classification Search
CPC ............ G01R 31/3679; H01M 10/441; H01M 10/482; H01M 10/486; H01M 2220/20
USPC ........................................................ 320/118
See application file for complete search history.

MAINTENANCE METHOD OF POWER BATTERY PACK

This is a U.S. national stage application of PCT Application No. PCT/CN2016/071355 under 35 U.S.C. 371, filed Jan. 19, 2016 in Chinese, claiming the priority benefit of Chinese Application No. 201510042071.2, filed Jan. 28, 2015, which is hereby incorporated by reference.

FIELD OF THE INVENTION

The present invention relates to the field of maintenance of a power battery pack, and in particular, to an improved maintenance method of a power battery pack.

BACKGROUND OF THE INVENTION

At present, single cells must be connected in series to form battery packs in energy storage power plants, electric vehicles and other applications. Since there exists differences in the battery capacity and performance caused by production process, and the differences will be expanded during the charging and discharging process of the battery pack, the risks of excessive charging and discharging will increase. At the same time, the battery pack capacity utilization rate is decreased, which will accelerate the damage to the battery in a vicious cycle. Therefore, in order to further improve the consistency of the battery pack, enhance the battery pack capacity utilization rate, extend the service life of battery pack, it is required to perform necessary maintenance for the battery pack, and maintain charging for batteries in the battery pack with low surplus capacity, and maintain discharging for batteries in the battery pack with high surplus capacity.

Currently, there are mainly maintenance methods, and generally it is divided into two types: one is voltage-based maintenance method, and the other is capacity-based maintenance method.

The voltage-based maintenance method is to perform maintenance discharging for batteries with high voltage and to perform maintenance charging for batteries with low voltage through various charging maintenance and discharging maintenance ways by maintaining battery pack's inconsistency via the voltage difference of single cells collected. This method is easy to control and widely applied. It usually includes the current shunt method and energy transfer method. For the current shunt method, generally the current of single cell is adjusted through resistors, and the maintenance current is controlled by switches to carry out discharging maintenance of single cells with excessively high voltage. For the energy transfer method, generally the energy is transferred from high-voltage cells to low-voltage cells through various media, to improve the consistency of battery pack voltage. The energy transfer media can be capacitors, inductors, transformers, etc.

The most fundamental purpose of maintenance is to balance the remaining capacity between batteries. The voltage-based maintenance mode can reflect the capacity characteristics, but can not accurately describe the status of remaining capacity of battery, thus the excessive balance phenomenon may appear, to worsen the consistency between battery pack. Internal chemical materials of lithium battery may result in this phenomenon. The polarization effect of lithium battery may cause the deviation of battery voltage from the balance value when the current flows through the battery; since it is unable to achieve consistency in the lithium battery production process, the remaining capacity may be different under the same voltage. Thus, the capacity-based balancing method can make up the above shortcomings, and provide safe and effective balance during the full cycle of lithium battery, extending its service life. The maintenance module is directly used to maintain discharge of battery with excessive remaining capacity and to maintain charging of battery with low remaining capacity. However, the capacity-based maintenance method needs to accurately estimate SOC of single cells; and the maintenance reliability will greatly reduced if the accuracy of SOC can not guaranteed.

SUMMARY OF THE INVENTION

In order to overcome the deficiencies of the prior art, the present invention provides an improved maintenance method of a power battery pack, which can perform analysis of various characteristic data of battery in a real-time manner and pick up the single cells that need charging and discharging maintenance during battery pack operation, and control the ratio of number of batteries that need charging maintenance to that needs discharging maintenance, to achieve bus balance. The single cells that need to maintain are maintained through fusion maintenance method. This method can effectively guarantee the consistency and further extend the service life of battery packs. In addition, through the maintenance control of internal charging and discharging, it can effectively reduce the loss of external power supply and weaken the dependence on external power supply, and it can supply power to the battery maintenance system without starting the external power supply under certain conditions.

To achieve the above objects of the invention, the invention adopts the technical solutions as follows:

An improved maintenance method of a power battery pack, wherein the battery pack comprises several single cells connected in series, comprising the following steps:

(1) conducting analysis on a battery pack Bat={$Bat_1$, $Bat_2$ ... $Bat_n$}, n is the number of battery pack single cells, n≥3, and n is an integer;

(2) data preprocessing; measuring and selecting m continuous voltages vol, currents curr, and temperatures temp collected, m is an integer equal to or greater than 3, to get the e raw data matrix Z;

$$Z = \begin{bmatrix} vol_{11} & \cdots & vol_{1m} \\ \cdots & \cdots & \cdots \\ vol_{n1} & \cdots & vol_{nm} \\ cur_1 & \cdots & cur_m \\ temp_1 & \cdots & temp_m \end{bmatrix}$$

The peak values of voltage, current and temperature data are removed and the averages are calculated to get the required voltage, current and temperature data, $volavg_i$, curavg, tempavg, 1≤i≤n;

$$volavg_i = \frac{1}{n-2}\left(\sum_{j=1}^{m} vol_{i,j} - \min_{1 \le j \le m}\{vol_{i,j}\} - \max_{1 \le j \le m}\{vol_{i,j}\}\right)$$

$$curavg_i = \frac{1}{n-2}\left(\sum_{j=1}^{m} cur_j - \min_{1 \le j \le m}\{cur_j\} - \max_{1 \le j \le m}\{cur_j\}\right)$$

-continued $$tempavg_i = \frac{1}{n-2}\left(\sum_{j=1}^{m} temp_1 - \min_{1\le j\le m}\{temp_j\} - \max_{1\le j\le m}\{temp_j\}\right)$$

(3) Conducting normalization processing of voltage data $volavg_i$ obtained in (2) and SOC $SOC_i$, SOH $SOH_i$ of single cell, as follows:

$$\overline{volavg_i} = \frac{volavg_i - \min_{1\le i\le n}\{volavg_i\}}{\max_{1\le i\le n}\{volavg_i\} - \min_{1\le i\le n}\{volavg_i\}}$$

$$\overline{SOCSOH_i} = \frac{SOC_i \times SOH_i - \min_{1\le i\le n}\{SOC_i \times SOH_i\}}{\max_{1\le i\le n}\{SOC_i \times SOH_i\} - \min_{1\le i\le n}\{SOC_i \times SOH_i\}}$$

$\overline{volavg_i}$ is the voltage of the ith single cell after normalization, $\overline{SOCSOH_i}$ is the product of SOC, SOH of the ith single cell after normalization, $1\le i\le n$, i is an integer;

(4) Calculating the charging and discharging levels of single cell that needs to maintain, and determining the battery sets that require charging and discharging maintenance;

The charging maintenance level of each cell is calculated as follows:

$$dCha_i = w_1 \times 10 \times \left(\frac{1}{n}\sum_{j=1}^{n}\overline{volavg_j} - \overline{volavg_i}\right) + w_2\left(\frac{1}{n}\sum_{j=1}^{n}\overline{SOCSOH_j} - \overline{SOCSOH_i}\right)$$

$$dDis_i = w_1 \times 10 \times \left(\overline{volavg_i} - \frac{1}{n}\sum_{j=1}^{n}\overline{volavg_j}\right) +$$

$$w_2\left(\overline{SOCSOH_i} - \frac{1}{n}\sum_{j=1}^{n}\overline{SOCSOH_j}\right)$$

where, $w_1$, $w_2$ are the weighted values of voltage factor and remaining capacity factor respectively, and $w_1+w_2=1$;

For all single cells, when $dCha_i > d_{cha}$, it is considered that the i-th single cell needs charging maintenance, $d_{cha}$ is the established charge maintenance threshold; when $dDis_i > d_{dis}$, it is considered that the i-th single cell needs discharging maintenance, and $d_{dis}$ is the established discharge maintenance threshold;

Thus, the battery set that needs charging maintenance is $Bat1=\{Bat1_1, Bat1_2 \ldots Bat1_x\}$, and the battery set that needs discharging maintenance is $Bat2=\{Bat2_1, Bat2_2 \ldots Bat2_y\}$, and x<n, y<n;

(5) Supposed that the charging maintenance current is a constant value $Cur_{cha}$, the discharging maintenance current is a constant value $Cur_{dis}$, to maintain balance, the ratio of number of batteries that need charging maintenance to the number of batteries that need discharging maintenance is $$\frac{Cur_{dis}}{Cur_{cha}},$$

then the ratio value is processed, to get the corresponding fraction in lowest term, which is $$\frac{Cur_{dis}'}{Cur_{cha}'};$$

when $Cur_{dis}' \ge Cur_{cha}'$, and $Cur_{dis}' > d$, d is the maximum number of charging maintenance and $n/4 \le d \le n/2$, then $$\frac{h_{cha}}{h_{dis}} = \frac{d}{\left\lceil \frac{d \times Cur_{cha}'}{Cur_{dis}'} \right\rceil},$$

that is the ratio of d to $$\frac{d \times Cur'_{cha}}{Cur'_{dis}}$$

rounded up to an integer; when $Cur_{dis}' \ge Cur_{cha}'$, and $Cur_{dis}' \le d$, then $$\frac{h_{cha}}{h_{dis}} = \frac{Cur'_{dis}}{Cur'_{cha}}; \text{ when } Cur'_{dis} < Cur'_{cha}, \text{ and } Cur'_{cha} > d, \text{ then}$$

$$\frac{h_{cha}}{h_{dis}} = \frac{\left\lfloor \frac{Cur'_{dis}}{d \times Cur'_{cha}} \right\rfloor}{d},$$

that is the ratio $$\text{of } \frac{Cur'_{dis}}{d \times Cur'_{cha}}$$

to d rounded down to an integer; when $Cur_{dis}' < Cur_{cha}'$, and $Cur_{cha}' \le d$, then $$\frac{h_{cha}}{h_{dis}} = \frac{Cur'_{dis}}{Cur'_{dis}};$$

$h_{cha}$ is the numerator of optimal ratio of the number of batteries that need charging maintenance to the number of batteries that need discharging maintenance under the maximum number of charging maintenance d, which is an integer; $h_{dis}$ is the denominator of optimal ratio of the number of batteries that need charging maintenance to the number of batteries that need discharging maintenance under the maximum number of charging maintenance d, which is an integer;

When $$\frac{x}{y} > \frac{h_{cha}}{h_{dis}},$$

the number of batteries that need discharging maintenance is $$Num_{dis} = \left\lfloor \frac{y}{h_{dis}} \right\rfloor \times h_{dis},$$

i.e. the product of $$\frac{y}{h_{dis}}$$

rounded down to an integer and $h_{dis}$, the number of batteries that need charging maintenance is $$Num_{cha} = \left\lfloor \frac{y}{h_{dis}} \right\rfloor \times h_{cha},$$

i.e. the product of $$\frac{y}{h_{dis}}$$

rounded down to an integer and $h_{cha}$; when $$\frac{x}{y} < \frac{h_{cha}}{h_{dis}},$$

the number of batteries that need discharging maintenance is $$Num_{dis} = \left\lfloor \frac{x}{h_{cha}} \right\rfloor \times h_{dis},$$

i.e. the product of $$\frac{x}{h_{cha}}$$

rounded down to an integer and, the number of batteries that need charging maintenance is $$Num_{cha} = \left\lfloor \frac{x}{h_{cha}} \right\rfloor \times h_{cha},$$

i.e. the product of $$\frac{x}{h_{cha}}$$

rounded down to an integer and $h_{cha}$; when $$\frac{x}{y} = \frac{h_{cha}}{h_{dis}},$$

the number of batteries that need charging maintenance is $Num_{cha}=x$, the number of batteries that need discharging maintenance is $Num_{dis}=y$;

(6) Sequencing the battery sets Bat1 and Bat2 in a descending order according to the degrees of charging maintenance and discharging maintenance of all batteries, to get the ordered set Bat3={$Bat3_1$, $Bat3_2$ ... $Bat3_x$} that need charging maintenance, and $Bat3_1 \geq Bat3_2 \geq ... \geq Bat3_x$, to get the ordered set Bat4={$Bat4_1$, $Bat4_2$ ... $Bat4_y$} that need discharging maintenance, and $Bat4_1 \geq Bat4_2 \geq ... \geq Bat4_y$;

(7) selecting from Bat3, Bat4 obtained from (6) according to (5) the number of batteries that need charging maintenance and discharging maintenance, to further obtain the sets of batteries that need charging maintenance and discharging maintenance. The set of batteries that needs charging maintenance is BatCha={$Bat3_1$, $Bat3_2$ ... $Bat3_{Num_{cha}}$}, and the set of batteries that needs discharging maintenance is BatDis={$Bat4_1$, $Bat4_2$ ... $Bat4_{Num_{dis}}$};

(8) The battery maintenance system can implement charging maintenance of single cells in battery set BatCha, and implement discharging maintenance of single cells in battery set BatD is.

Preferably, the charge maintenance threshold is $d_{cha}=0.2$ in the step (4).

Preferably, the discharge maintenance threshold is $d_{dis}=0.2$. The fraction in lowest term is known as irreducible fraction, the numerator and denominator of the fraction is a prime number.

Preferably, d is an integer closest to (n/3) in the step (5).

The SOC (state of charge) refers to the ratio of the remaining capacity of a storage battery after using a period of time or a long time of non-use to the fully charged capacity, which is usually expressed as a percentage, and its range is 0 to 1, when SOC=0, it indicates that the battery is fully discharged, when SOC=1, it indicates that the battery is fully charged.

The Battery SOH (State of Health) is to describe SOH of power battery, especially used in various kinds of power batteries in electric vehicle field, such as SOH of lead-acid batteries, nickel metal hydride batteries, lithium batteries, and remaining service life. The calculation or estimation of SOH can refer to the existing methods disclosed in prior art, for example, methods disclosed in the Chinese Patents Nos. 102508164A, 101208847, 102866361A, 102520361A, and so on.

The present invention provides an improved maintenance method of a power battery pack, which can perform analysis of various characteristic data of battery in a real-time manner and pick up the single cells that need charging and discharging maintenance during battery pack operation, and control the ratio of number of batteries that need charging maintenance to that needs discharging maintenance, to achieve bus balance. This method can effectively guarantee the consistency and further extend the service life of batter packs; in addition, through the maintenance control of internal charging and discharging, it can effectively reduce the loss of external power supply and weaken the dependence on external power supply.

DETAILED DESCRIPTION OF THE EMBODIMENTS

Figure 1:
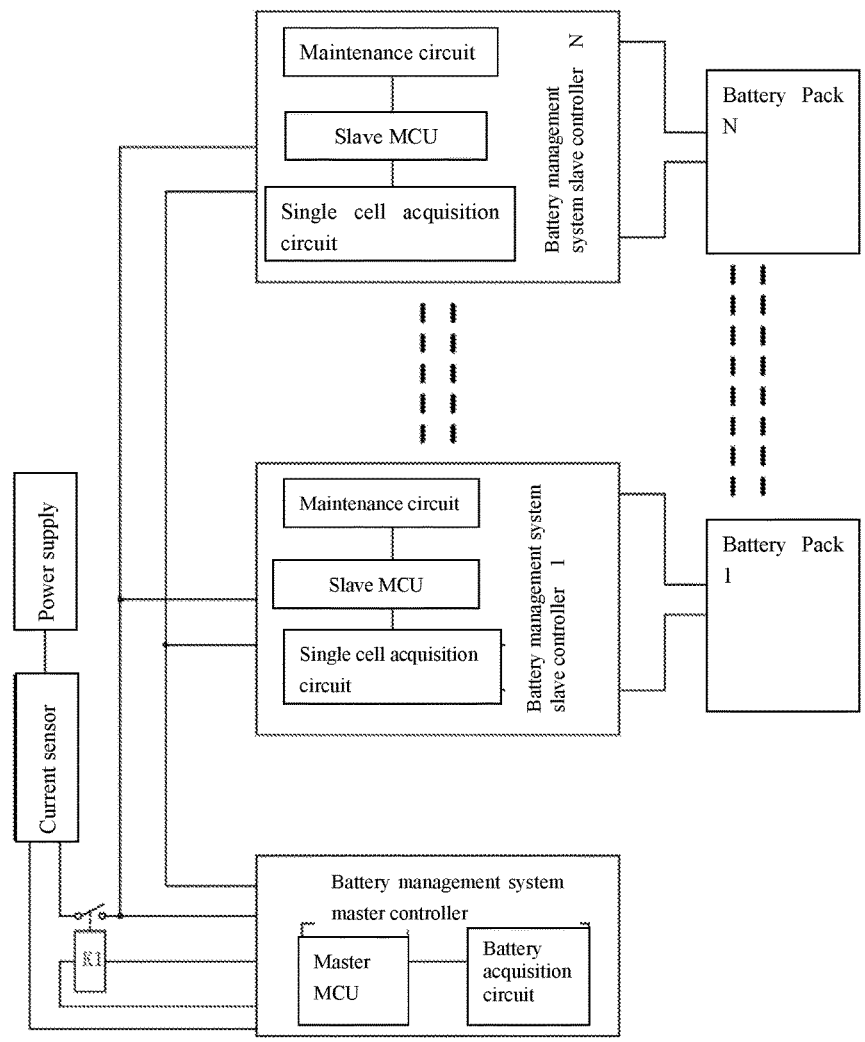
FIG. 1 is a functional block diagram of a power battery pack maintenance system in the present invention.

The present invention is further described in combination with embodiments and drawings, but the scope of protection in the present invention is not limited herein.

An improved maintenance method of a power battery pack, wherein the battery pack comprises several single cells connected in series, comprising the following steps:

(1) conducting analysis on battery pack Bat={Bat$_1$, Bat$_2$ ... Bat$_n$}, n is the number of battery pack single cells, n≥3, and n is an integer;

(2) data preprocessing; measuring and selecting m continuous voltages vol, currents curr, and temperatures temp collected, m is an integer equal to or greater than 3, to get the e raw data matrix Z;

$$Z = \begin{bmatrix} vol_{11} & \ldots & vol_{1m} \\ \ldots & \ldots & \ldots \\ vol_{n1} & \ldots & vol_{nm} \\ cur_1 & \ldots & cur_m \\ temp_1 & \ldots & temp_m \end{bmatrix}$$

The peak values of voltage, current and temperature data are removed and the averages are calculated to get the required voltage, current and temperature data, volavg$_i$, curavg, tempavg, 1≤i≤n;

$$volavg_i = \frac{1}{n-2}\left(\sum_{j=1}^{m} vol_{ij} - \min_{1 \le j \le m}\{vol_{ij}\} - \max_{1 \le j \le m}\{vol_{ij}\}\right)$$

$$curavg = \frac{1}{n-2}\left(\sum_{j=1}^{m} cur_j - \min_{1 \le j \le m}\{cur_j\} - \max_{1 \le j \le m}\{cur_j\}\right)$$

$$tempavg = \frac{1}{n-2}\left(\sum_{j=1}^{m} temp_j - \min_{1 \le j \le m}\{temp_j\} - \max_{1 \le j \le m}\{temp_j\}\right)$$

(3) Conducting normalization processing of voltage data volavg$_i$ obtained in (2) and state of charge SOC$_i$, state of health SOH$_i$ of single cell, as follows:

$$\overline{volavg_i} = \frac{volag_i - \min_{1 \le i \le n}\{volavg_i\}}{\max_{1 \le i \le n}\{volavg_i\} - \min_{1 \le i \le n}\{volavg_i\}}$$

$$\overline{SOCSOH_i} = \frac{SOC_i \times SOH_i - \min_{1 \le i \le n}\{SOC_i \times SOH_i\}}{\max_{1 \le i \le n}\{SOC_i \times SOH_i\} - \min_{1 \le i \le n}\{SOC_i \times SOH_i\}} \overline{volavg_i}$$

is the voltage of the ith single cell after normalization, $\overline{SOCSOH_i}$ is the product of SOC, SOH of the ith single cell after normalization, 1≤i≤n, i is an integer;

(4) Calculating the charging and discharging levels of single cell that needs to maintain, and determining the battery sets that require charging and discharging maintenance;

The charging maintenance level of each cell is calculated as follows:

$$dCha_i = w_1 \times 10 \times \left(\frac{1}{n}\sum_{j=1}^{n} \overline{volavg_j} - \overline{volavg_i}\right) + w_2\left(\frac{1}{n}\sum_{j=1}^{n} \overline{SOCSOH_j} - \overline{SOCSOH_i}\right)$$

$$dDis_i = w_1 \times 10 \times \left(\overline{volavg_i} - \frac{1}{n}\sum_{j=1}^{n} \overline{volavg_j}\right) +$$

$$w_2\left(\overline{SOCSOH_i} - \frac{1}{n}\sum_{j=1}^{n} \overline{SOCSOH_j}\right)$$

where, $w_1$, $w_2$ are the weighted values of voltage factor and remaining capacity factor respectively, and $w_1+w_2=1$;

For all single cells, when dCha$_i$>d$_{cha}$, it is considered that the i-th single cell needs charging maintenance, d$_{cha}$ is the established charge maintenance threshold, 0<d$_{cha}$<1; when dDis$_i$>d$_{dis}$, it is considered that the i-th single cell needs discharging maintenance, and d$_{dis}$ is the established discharge maintenance threshold, 0<d$_{dis}$<1;

Thus, the battery set that needs charging maintenance is Bat1={Bat1$_1$, Bat1$_2$ ... Bat1$_x$}, and the battery set that needs discharging maintenance is Bat2={Bat2$_1$, Bat2$_2$ ... Bat2$_y$}, and x<n, y<n;

(5) Supposed that the charging maintenance current is a constant value Cur$_{cha}$, the discharging maintenance current is a constant value Cur$_{dis}$, to maintain balance, the ratio of number of batteries that need charging maintenance to the number of batteries that need discharging maintenance is $$\frac{Cur_{dis}}{Cur_{cha}},$$

then the ratio value is processed, to get the corresponding fraction in lowest term, which is $$\frac{Cur'_{dis}}{Cur'_{cha}};$$

when Cur$_{dis}$'≥Cur$_{cha}$', and Cur$_{dis}$'>d, d is the maximum number of charging maintenance and n/4≤d≤n/2, then $$\frac{h_{cha}}{h_{dis}} = \frac{d}{\left\lceil \frac{d \times Cur'_{cha}}{Cur'_{dis}} \right\rceil},$$

that is the ratio of d to $$\frac{d \times Cur'_{cha}}{Cur'_{dis}}$$

rounded up to an integer; when Cur$_{dis}$'≥Cur$_{cha}$', and Cur$_{dis}$'≤d, then $$\frac{h_{cha}}{h_{dis}} = \frac{Cur'_{dis}}{Cur'_{cha}};$$

when Cur$_{dis}$'<Cur$_{cha}$', and Cur$_{cha}$'>d, then $$\frac{h_{cha}}{h_{dis}} = \frac{\left\lfloor \frac{Cur'_{dis}}{d \times Cur'_{cha}} \right\rfloor}{d},$$

that is the ratio of $$\frac{Cur'_{dis}}{d \times Cur'_{cha}}$$

to d rounded down to an integer; when $Cur_{dis}' < Cur_{cha}'$, and $Cur_{cha}' \leq d$, then $$\frac{h_{cha}}{h_{dis}} = \frac{Cur'_{dis}}{Cur'_{cha}};$$

When $$\frac{x}{y} > \frac{h_{cha}}{h_{dis}},$$

the number of batteries that need discharging maintenance is $$Num_{dis} = \left\lfloor \frac{y}{h_{dis}} \right\rfloor \times h_{dis},$$

i.e. the product of $$\frac{y}{h_{dis}}$$

rounded down to an integer and $h_{dis}$, the number of batteries that need charging maintenance is $$Num_{cha} = \left\lfloor \frac{y}{h_{dis}} \right\rfloor \times h_{cha},$$

i.e. the product of $$\frac{y}{h_{dis}}$$

rounded down to an integer and $h_{cha}$; when $$\frac{x}{y} < \frac{h_{cha}}{h_{dis}},$$

the number of batteries that need discharging maintenance is $$Num_{dis} = \left\lfloor \frac{x}{h_{cha}} \right\rfloor \times h_{dis},$$

i.e. the product of $$\frac{x}{h_{cha}}$$

rounded down to an integer and, the number of batteries that need charging maintenance is $$Num_{cha} = \left\lfloor \frac{x}{h_{cha}} \right\rfloor \times h_{cha},$$

i.e. the product of $$\frac{x}{h_{cha}}$$

rounded down to an integer and $h_{cha}$; when $$\frac{x}{y} = \frac{h_{cha}}{h_{dis}},$$

the number of batteries that need charging maintenance is $Num_{cha}=x$, the number of batteries that need discharging maintenance is $Num_{dis}=y$;

(6) Sequencing the battery sets Bat1 and Bat2 in a descending order according to the degrees of charging maintenance and discharging maintenance of all batteries, to get the ordered set Bat3={Bat3$_1$, Bat3$_2$ ... Bat3$_x$} that need charging maintenance, and Bat3$_1 \geq$ Bat3$_2 \geq$ ... $\geq$ Bat3$_x$, to get the ordered set Bat4={Bat4$_1$, Bat4$_2$ ... Bat4$_y$} that need discharging maintenance, and Bat4$_1 \geq$ Bat4$_2 \geq$ ... $\geq$ Bat4$_y$;

(7) selecting from Bat3, Bat4 obtained from (6) according to the number of batteries that need charging maintenance and discharging maintenance in (5), to further obtain the sets of batteries that need charging maintenance and discharging maintenance. The set of batteries that needs charging maintenance is BatCha={Bat3$_1$, Bat3$_2$ ... Bat3$_{Num_{cha}}$}, and the set of batteries that needs discharging maintenance is BatDis={Bat4$_1$, Bat4$_2$ ... Bat4$_{Num_{dis}}$};

(8) The battery maintenance system can implement charging maintenance of single cells in battery set BatCha, and implement discharging maintenance of single cells in battery set BatDis. The charge maintenance threshold is $d_{cha}=0.2$ and the discharge maintenance threshold is $d_{dis}=0.2$ in the step (4). d is an integer closest to (n/3) in the step (5).

The present invention also provides a two-way isolation constant current maintenance system based on a common device power supply adapted to an improved maintenance method of power battery pack, as shown in FIG. 1, it is used for maintaining the battery pack composed of single battery pack, comprising a power supply, an electronic switch K1, a current sensor, a battery management system master controller, and a plurality of battery management system slave controllers; wherein the power supply is connected to the current sensor, and the current sensor is connected to the electronic switch K1 and the battery management system master controller respectively, the electronic switch is connected to the battery management system master controller and the battery management system slave controller respectively. The battery management system master controller is connected to a plurality of battery management system slave controllers communicatively, and each battery management system slave controller is connected to a battery pack respectively.

The battery management system slave controller comprises a maintenance circuit, a single cell acquisition circuit and a slave MCU; the battery management system master controller comprises a battery pack acquisition circuit and a master MCU. The slave MCU is connected to the maintenance circuit and the single cell acquisition circuit respectively, and the single cell acquisition circuit is connected to both ends of the single cell, used for data acquisition of single cells such as voltage, current, temperature, etc. The master MCU is connected to the battery pack collection circuit, and the battery pack acquisition circuit is connected to both ends of the battery pack, used for data acquisition of battery pack such as voltage, current, temperature, etc.

Figure 2:
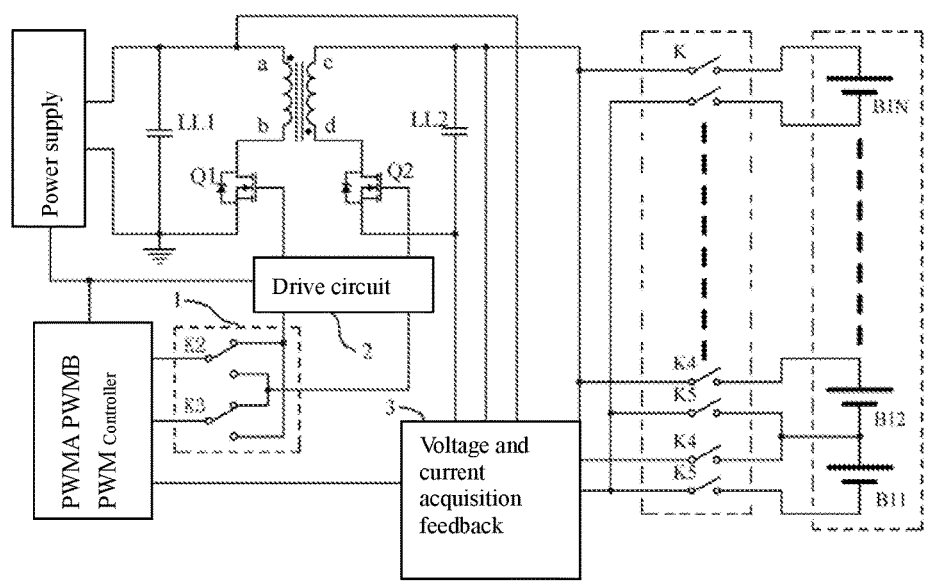
FIG. 2 is a circuit diagram of a maintenance circuit in the present invention.
Figure 3:
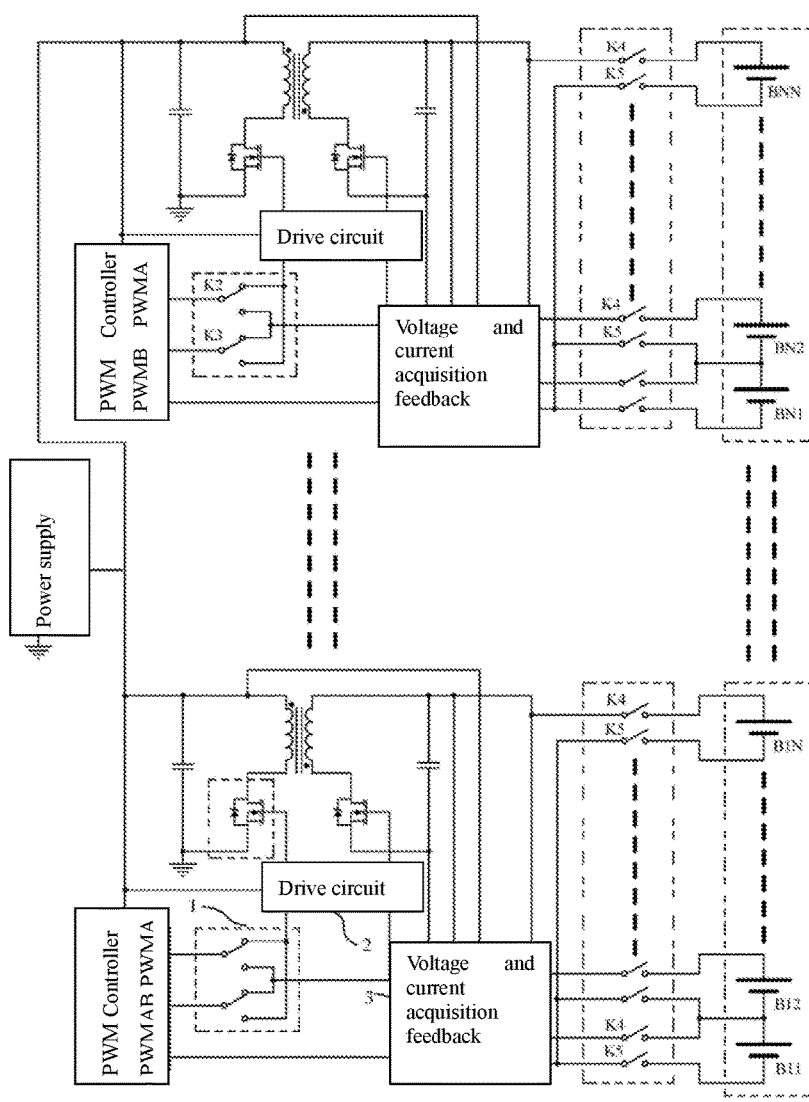
FIG. 3 is a connecting circuit diagram of several maintenance circuits in the present invention.

Referring to FIG. 2 and FIG. 3, the maintenance circuit comprises a PWM controller, a filter capacitor LL1, a FET Q1, a transformer T, a FET Q2, a filter capacitor LL2, a gating switch K, a signal switching circuit 1, a drive circuit 2, a voltage current-sensing feedback circuit 3. The both ends a and b of the primary coil of the transformer T are connected to one end of filter capacitor LL1 and the drain of FET Q1 respectively, the source of the FET Q is connected to another end of the filter capacitor LL1 and the ground, the c, d ends of the secondary coil of the transformer T are connected to another end of the filter capacitor LL2 and the drain of FET Q2, the source of the FET Q2 is connected to another end of filter capacitor LL2 and the voltage current-sensing feedback circuit 3. The gates of FET Q1 and FET Q2 are connected to drive circuit 2 respectively, and the a end of primary coil of transformer T and the c end of the secondary coil are connected to voltage current-sensing feedback circuit 3 respectively, the both ends of filter capacitor LL1 are connected to the positive and negative poles of power supply, the PWM controller is connected to the voltage current-sensing feedback circuit 3, signal switching circuit 1 and the power supply respectively, and the signal switching circuit 1 is connected to the drive circuit 2, the voltage current-sensing feedback circuit 3 is connected to the gating switch, the gating switch is connected to the battery pack to be tested;

The gating switch K comprises a plurality of positive switch K4 and negative switch K5 corresponding to each single cell; one end of each positive switch K4 is connected to voltage current-sensing feedback circuit, and the other end is connected to the positive electrode of the corresponding single cell; One end of each negative switch K5 is connected to the voltage current-sensing feedback circuit, and the other end is connected to the negative electrode of the corresponding single cell.

The PWM controller in each maintenance circuit is connected to the battery management system master controller communicatively. The power supply is a switching power supply or a battery energy storage device.

The signal switching circuit comprises two single-pole two-way switches K2, K3, and one end of the single-pole two-way switches K2, K3 are connected to PWMA port and PWMB port of the PWM controller; and the other end of the single-pole two-way switch K2, K3 are connected to a drive circuit. The drive circuit controls the starting of FET Q1, Q2. The voltage current-sensing feedback circuit is realized by the existing mature technology.

The working principle of the system is as follows: PWM controller generates two ways of PWM signals: PWMA and PWMB, of which, PWMA is main excitation signal, PWMB is the synchronous rectification signal, and through a signal switching circuit 1, PWMA and PWMB are distributed to FET Q1 and FET Q2; when charging, PWMA signal controls FET Q1, PWMB signal controls FET Q2, and when discharging, PWMA signal controls FET Q2, PWMB signal controls FET Q1. One single cell of the battery pack controlled by gating switch K is selected, and the single cell selected is charged or discharged. The voltage current-sensing feedback circuit 13 acquires the charge or discharge current and feeds back to the PWM controller, to achieve constant current charging or discharging; at the same time, acquires the voltage on both sides to achieve overvoltage protection. The switch timing of FET Q1 and the FET Q2 during charging: a. FET Q1 is on and FET Q2 is off, the energy of power supply is transferred to the transformer T through the FET Q1; b. FET Q1 is off, FET Q2 is off, the energy of transformer T is transferred to filter capacitor LL2 and single cell through FET Q2 body diode, and this process is transient, called dead time; c. FET Q1 is off, FET Q2 is on, the energy of transformer T is transferred to filter capacitor LL2 and single cell through FET Q2; since the FET Q2 voltage drop is much lower than its body diode, the FET Q2 synchronous rectification can greatly improve the efficiency of the balance of power supply; d. FET Q1 is off, FET Q2 is off, the process is transient, called dead time, and thus a cycle ends, and the charging process is a continuous cycle of the four processes. Similarly, during discharging, the timing of FET Q1 and FET Q2 are reversed as compared to the charging process.

The maintenance system of power battery pack in the present invention does not require continuous or long-term power supply; when system is in normal operation, the power supply can be disconnected; and at the same time, though control on the number of charge-discharge maintenance channels of current sensor, maintenance circuit, it can achieve bus-powered balance, which avoids the deficiency of other system programs that require independent and stable, long-term power supply and independent balanced power supply. This system can quickly enhance the battery efficiency, and effectively extend the service life of the battery pack.

The embodiments described herein are merely examples of the structure herein. Technicians skilled in the art can modify or supplement the specific embodiments or replace them by similar ways, but without departing from the spirit of the invention or beyond the scope defined in claims.

The invention claimed is:

1. An improved maintenance method of a power battery pack, wherein the battery pack comprises several single cells connected in series, comprising the following steps:
   (1) conducting analysis on battery pack Bat={$Bat_1$, $Bat_2$ ... $Bat_n$}, n is the number of battery pack single cells, n≥3, and n is an integer;
   (2) data preprocessing; measuring and selecting m continuous voltages "vol", currents "curr", and temperatures temp collected, m is an integer equal to or greater than 3, to get the raw data matrix Z;

$$Z = \begin{bmatrix} vol_{11} & \cdots & vol_{1m} \\ \cdots & \cdots & \cdots \\ vol_{n1} & \cdots & vol_{nm} \\ cur_1 & \cdots & cur_m \\ temp_1 & \cdots & temp_m \end{bmatrix}$$

the peak values of voltage, current and temperature data are removed and the averages are calculated to get the required voltage, current and temperature data, $volavg_i$, curavg, tempavg, 1≤i≤n;

$$volavg_i = \frac{1}{n-2}\left(\sum_{j=1}^{m} vol_{ij} - \min_{1 \le j \le m}\{vol_{ij}\} - \max_{1 \le j \le m}\{vol_{ij}\}\right)$$

$$curavg = \frac{1}{n-2}\left(\sum_{j=1}^{m} cur_j - \min_{1 \le j \le m}\{cur_j\} - \max_{1 \le j \le m}\{cur_j\}\right)$$

$$tempavg = \frac{1}{n-2}\left(\sum_{j=1}^{m} temp_j - \min_{1 \le j \le m}\{temp_j\} - \max_{1 \le j \le m}\{temp_j\}\right)$$

(3) conducting normalization processing of voltage data "$volavg_i$" obtained in (2) and state of charge $SOC_i$, state of health $SOH_i$ of single cell, as follows:

$$\overline{volavg_i} = \frac{volavg_i - \min_{1 \le i \le n}\{volavg_i\}}{\max_{1 \le i \le n}\{volavg_i\} - \min_{1 \le i \le n}\{volavg_i\}}$$

$$\overline{SOCSOH_i} = \frac{SOC_i \times SOH_i - \min_{1 \le i \le n}\{SOC_i \times SOH_i\}}{\max_{1 \le i \le n}\{SOC_i \times SOH_i\} - \min_{1 \le i \le n}\{SOC_i \times SOH_i\}} \overline{volavg_i}$$

is the voltage of the ith single cell after normalization, $\overline{SOCSOH_i}$ is the product of SOC, SOH of the ith single cell after normalization, $1 \le i \le n$, i is an integer;

(4) calculating the charging and discharging levels of single cell that needs to maintain, and determining the battery sets that require charging and discharging maintenance;

the charging maintenance level of each cell is calculated as follows:

$$dCha_i = w_1 \times 10 \times \left(\frac{1}{n}\sum_{j=1}^{n}\overline{volavg_j} - \overline{volavg_i}\right) + w_2\left(\frac{1}{n}\sum_{j=1}^{n}\overline{SOCSOH_j} - \overline{SOCSOH_i}\right)$$

$$dDis_i = w_1 \times 10 \times \left(\overline{volavg_i} - \frac{1}{n}\sum_{j=1}^{n}\overline{volavg_j}\right) + w_2\left(\overline{SOCSOH_i} - \frac{1}{n}\sum_{j=1}^{n}\overline{SOCSOH_j}\right)$$

where $w_1$, $w_2$ are the weighted values of voltage factor and remaining capacity factor respectively, and $w_1 + w_2 = 1$;

for all single cells, when $dCha_i > d_{cha}$, it is considered that the i-th single cell needs charging maintenance, $d_{cho}$ is the established charge maintenance threshold; when $dDis_i > d_{dis}$, it is considered that the i-th single cell needs discharging maintenance, and $d_{dis}$ is the established discharge maintenance threshold;

thus, the battery set that needs charging maintenance is $Bat1 = \{Bat1_1, Bat1_2 \ldots Bat1_x\}$, and the battery set that needs discharging maintenance is $Bat2 = \{Bat2_1, Bat2_2 \ldots Bat2_y\}$, and $x < n$, $y < n$;

(5) the charging maintenance current is a constant value $Cur_{cho}$, the discharging maintenance current is a constant value $Cur_{dis}$, to maintain balance, the ratio of number of batteries that need charging maintenance to the number of batteries that need discharging maintenance is $$\frac{Cur_{dis}}{Cur_{cha}},$$

then the ratio value is processed, to get the corresponding fraction in lowest term, which is $$\frac{Cur'_{dis}}{Cur'_{cha}};$$

when $Cur_{dis}' \ge Cur_{cho}'$, and $Cur_{dis}' > d$, d is the maximum number of charging maintenance and $n/4 \le d \le n/2$, then $$\frac{h_{cha}}{h_{dis}} = \frac{d}{\left\lceil \frac{d \times Cur'_{cha}}{Cur'_{dis}} \right\rceil},$$

that is the ratio of d to $$\frac{d \times Cur'_{cha}}{Cur'_{dis}}$$

rounded up to an integer; when $Cur_{dis}' \ge Cur_{cho}'$, and $Cur_{dis}' \le d$, then $$\frac{h_{cha}}{h_{dis}} = \frac{Cur'_{dis}}{Cur'_{cha}}; \text{ when } Cur'_{dis} < Cur'_{cha}, \text{ and}$$

$$Cur'_{cha} > d, \text{ then } \frac{h_{cha}}{h_{dis}} = \frac{\left\lfloor \frac{Cur'_{dis}}{d \times Cur'_{cha}} \right\rfloor}{d},$$

that is the ratio of $$\frac{Cur'_{dis}}{d \times Cur'_{cha}}$$

to d rounded down to an integer; when $Cur_{dis}' < Cur_{cho}'$, and $Cur_{cho}' \le d$, then $$\frac{h_{cha}}{h_{dis}} = \frac{Cur'_{dis}}{Cur'_{cha}};$$

$h_{cho}$ is the numerator of optimal ratio of the number of batteries that need charging maintenance to the number of batteries that need discharging maintenance under the maximum number of charging maintenance d, which is an integer; $h_{dis}$ is the denominator of optimal ratio of the number of batteries that need charging maintenance to the number of batteries that need discharging maintenance under the maximum number of charging maintenance d, which is an integer;

when $$\frac{x}{y} > \frac{h_{cha}}{h_{dis}},$$

the number of batteries that need discharging maintenance is $$Num_{dis} = \left\lfloor \frac{y}{h_{dis}} \right\rfloor \times h_{dis},$$

the product of $$\frac{y}{h_{dis}}$$

rounded down to an integer and $h_{dis}$, the number of batteries that need charging maintenance is $$Num_{cha} = \left\lfloor \frac{y}{h_{dis}} \right\rfloor \times h_{cha},$$

the product of $$\frac{y}{h_{dis}}$$

rounded down to an integer and $h_{cho}$; when $$\frac{x}{y} < \frac{h_{cha}}{h_{dis}},$$

the number of batteries that need discharging maintenance is $$Num_{dis} = \left\lfloor \frac{x}{h_{cha}} \right\rfloor \times h_{dis},$$

the product of $$\frac{x}{h_{cha}}$$

rounded down to an integer and, the number of batteries that need charging maintenance is $$Num_{cha} = \left\lfloor \frac{x}{h_{cha}} \right\rfloor \times h_{cha},$$

the product of $$\frac{x}{h_{cha}}$$

rounded down to an integer and $h_{cha}$; when $$\frac{x}{y} = \frac{h_{cha}}{h_{dis}},$$

the number of batteries that need charging maintenance is $Num_{cha}=x$, the number of batteries that need discharging maintenance is $Num_{dis}=y$;

(6) sequencing the battery sets Bat1 and Bat2 in a descending order according to the degrees of charging maintenance and discharging maintenance of all batteries, to get the ordered set Bat3={Bat3$_1$, Bat3$_2$ ... Bat3$_x$} that need charging maintenance, and Bat3$_1 \geq$Bat3$_2 \geq$ ... $\geq$Bat3$_x$, to get the ordered set Bat4={Bat4$_1$, Bat4$_2$, ... Bat4$_y$} that need discharging maintenance, and Bat4$_1 \geq$Bat4$_2 \geq$ ... $\geq$Bat4$_y$;

(7) selecting from Bat3, Bat4 obtained from (6) according to the number of batteries that need charging maintenance and discharging maintenance, to further obtain the sets of batteries that need charging maintenance and discharging maintenance, the set of batteries that needs charging maintenance is BatCha={Bat3$_1$, Bat3$_2$ ... Bat3$_{Num_{cha}}$}, and the set of batteries that needs discharging maintenance is BatDis={Bat4$_1$, Bat4$_2$ ... Bat4$_{Num_{dis}}$};

(8) the battery maintenance system performing the charging maintenance of single cells in battery set BatCha, and performing the discharging maintenance of single cells in battery set BatDis.

2. The improved maintenance method of power battery pack according to claim 1, wherein the charge maintenance threshold is $d_{cha}=0.2$ in the step (4).

3. The improved maintenance method of power battery pack according to claim 1, wherein the discharge maintenance threshold is $d_{dis}=0.2$ in the step (4).

4. The improved maintenance method of power battery pack according to claim 1, wherein d is an integer closest to (n/3) in the step (5).

* * * * *